US009257787B2

(12) United States Patent
Stowers et al.

(10) Patent No.: US 9,257,787 B2
(45) Date of Patent: Feb. 9, 2016

(54) INTERFACE DEVICE

(75) Inventors: Jeffery P. Stowers, Mount Sidney, VA (US); Randall C. Garman, Waynesboro, VA (US); Randall L. Herron, Waynesboro, VA (US); Darryl M. Ashby, Weyers Cave, VA (US); Lucas A. Harman, Waynesboro, VA (US)

(73) Assignee: Virginia Panel Corporation, Waynesboro, VA (US)

( * ) Notice: Subject to any disclaimer, the term of this patent is extended or adjusted under 35 U.S.C. 154(b) by 1787 days.

(21) Appl. No.: 12/691,128

(22) Filed: Jan. 21, 2010

(65) Prior Publication Data

US 2010/0194417 A1 Aug. 5, 2010

Related U.S. Application Data

(60) Provisional application No. 61/149,668, filed on Feb. 3, 2009.

(51) Int. Cl.

*G01R 31/20* (2006.01)
*H01R 13/629* (2006.01)
*H01R 13/627* (2006.01)
*H01R 13/621* (2006.01)

(52) U.S. Cl.

CPC .......... *H01R 13/629* (2013.01); *H01R 13/6275* (2013.01); *H01R 13/621* (2013.01); *H01R 13/62911* (2013.01)

(58) Field of Classification Search

None

See application file for complete search history.

(56) References Cited

U.S. PATENT DOCUMENTS

| | | | | |
|---|---|---|---|---|
| 5,562,458 A * | 10/1996 | Stora et al. | .................... | 439/348 |
| 5,820,401 A * | 10/1998 | Hasz et al. | .................... | 439/364 |
| 5,966,023 A | 10/1999 | Burgers et al. | | |
| 6,882,138 B2 | 4/2005 | Langouet et al. | | |
| 7,297,014 B1 | 11/2007 | Stowers et al. | | |
| D561,125 S | 2/2008 | Stowers et al. | | |

* cited by examiner

*Primary Examiner* — Paresh Patel

(74) *Attorney, Agent, or Firm* — 24IP Law Group; Timothy R DeWitt

(57) ABSTRACT

In a preferred embodiment, the present invention is an interface device comprising a receiver and a test adapter. The receiver has on each outer side a groove or ridge for use in initial engagement of the test adapter with the receiver. The test adapter has an engagement member having a plurality of clips arranged such that at least one clip engages with the groove or ridge on a side of the receiver. The test adapter further has a screw mechanism for drawing the engagement in and out of the test adapter to engage and disengage the test adapter with the receiver.

9 Claims, 13 Drawing Sheets

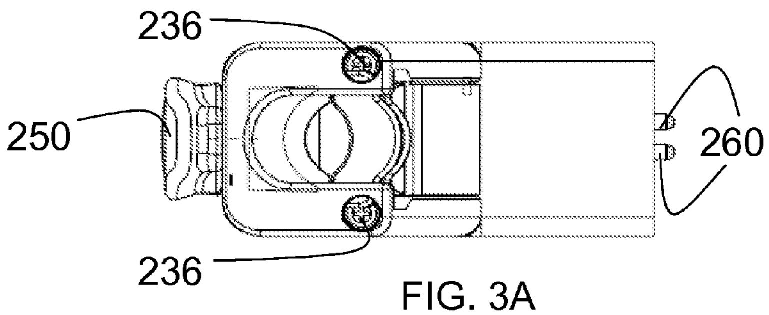
FIG. 3A
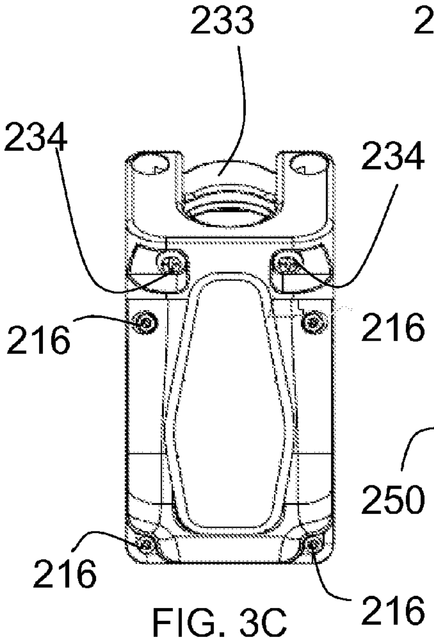
FIG. 3C
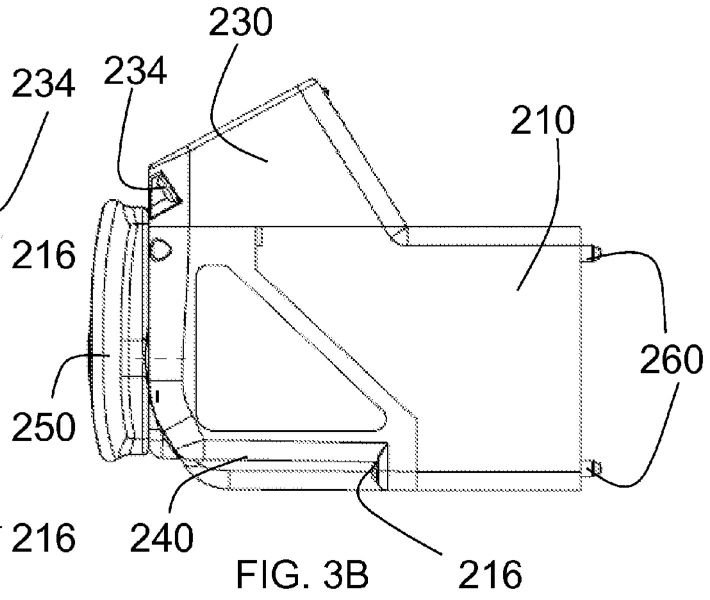
FIG. 3B
FIG. 3D
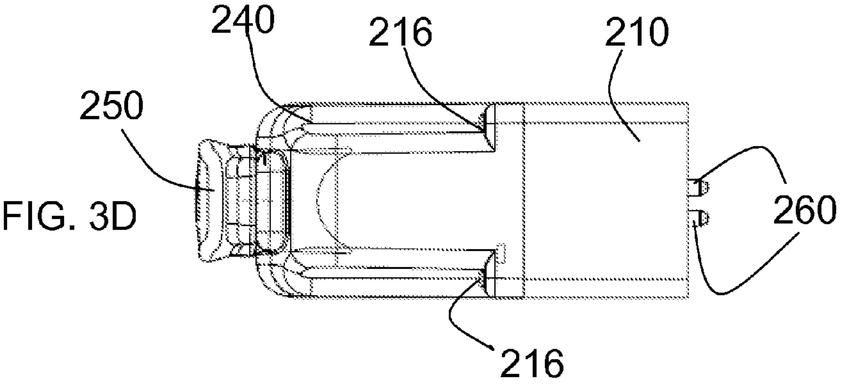

INTERFACE DEVICE

CROSS-REFERENCE TO RELATED APPLICATIONS

The present application claims the benefit of the filing date of U.S. Provisional Patent Application Ser. No. 61/149,668 filed by the present inventors on Feb. 3, 2009.

The aforementioned provisional patent application is hereby incorporated by reference in its entirety.

STATEMENT REGARDING FEDERALLY SPONSORED RESEARCH OR DEVELOPMENT

None.

BACKGROUND OF THE INVENTION

1. Field of the Invention

The present invention relates to an apparatus for securing and locking interfaces of two items releasably together and more particularly to an apparatus for securing and locking together an array of electrical connectors in a common frame.

2. Brief Description of the Related Art

A variety of mass interconnect devices have been used in the past. One example of prior art interface systems was disclosed in U.S. Pat. No. 4,329,005, entitled "Slide Cam Mechanism for Positioning Test Adapter in Operative Relationship with a Receiver," which was assigned to Virginia Panel Corporation. In the '005 patent, the receiver included an inner frame and outer walls. Between the outer walls and adjacent sides of the receiver frame were placed fixed hanger plates provided with straight slots and interior slides having coacting cam slots. The slides were driven by a hand lever and attached round torsion shaft with connected linkage having an over-dead-center locked position. Movement of the hand lever would cause the slides to move parallel to the outer walls and interior sides. Modules for holding various electrical contacts were mounted in the receiver parallel to the direction of movement of the slides.

The individual test adapter, or ITA, had four split roller dual bearings or rollers on common dry lube sleeves that would rotate oppositely during the camming action to minimize friction. The individual test adapter rollers rested on dwell shoulders of the cam slots and then descended through the straight slots during movement of the slides of the receiver to produce positive straight-on engagement of the test adapter and receiver multiple contacts. The slides had elongated linear guide bearings with dry lube pads for precision free movement. The slides were connected to a cylindrical torsion shaft via linkage. Like the receiver modules, the ITA modules were mounted in the system in a direction parallel to the ITA sides on which the rollers were located. When modules, pins, patchcords, and perhaps a cover are mounted to or on the interface test adapter, the assembly is sometimes referred to as a "fixture."

Another prior art system has been known as the MAC Panel Series 06, or rotating latch, interface device. In the rotating latch type device, the camming is performed by plates that rotate rather than moving in a linear fashion. In the rotating latch devices, the connector modules have been mounted to the receiver and test adapter frame parallel to the plant of rotation of the rotating latches.

Another prior art system sold by Virginia Panel Corporation included a receiver that included slides similar to those disclosed in the '005 patent but used pins at two corners, diagonal from one other, on the receiver. These pins inhibited vertical movement of the ITA in the receiver to produce straight-on engagement. This prior art system included machined side rails and a cylindrical torsion shaft.

Another prior interface device is known as the TTI Testron VG Series interface device. This device may be in a tabletop or a rack-mounted form. This VG Series device included a fixture support plate mounted to the receiver in a direction perpendicular to the face of the receiver. The receiver would be mounted directly to the test equipment.

The TTI Testron fixture, or test adapter, would be engaged to the receiver by lifting the fixture onto a pair of hooks protruding from the face of the receiver and then resting the fixture on the support plate. A handle and gears were used to pull the hooks, and hence, the fixture, into the receiver to cause the electrical contacts in the receiver and the fixture to mate.

Yet another prior art test system was used prior to 1980 in connection with the federal government's F-16 program. That system had a slide plate on each side of the receiver, with each slide plate connecting to the engagement pins on the sides of a corresponding ITA frame and each slide plate being pulled into the receiver via a connection near the center of the slide plate. This system suffered from significant problems of the ITA tilting to some degree and thereby causing contacts to be crushed.

Still other prior art engagement systems include those disclosed in U.S. Pat. No. 5,966,023. In still other prior art engagement systems, others have incorporated the use of a screw together engager that utilizes a range of thread styles including standard, Acme and high pitch helical grooves. The amount of rotation to engage these ranges from 180° to several full turns. One example of such a screw type engager is disclosed in U.S. Pat. No. 5,562,458 entitled "Interface Engagement and Locking System."

The systems that utilize standard threads or single start Acme threads typically require several turns to fully engage. Although they do not need lubrication, they have a tendency to cross-thread easily. The systems that employ helical grooves typically only require 180° of rotation to achieve full engagement but require a high amount of torque and the use of lubrication to maintain an only somewhat smooth feel during the process of engaging and disengaging. Even with the use of lubrication, these systems show a consistent pattern of extremely high wear on some of the components involved in the engagement procedure. The torque and the wear issues worsen over the cycle life of the system. Also, considering the geometry of these systems, the lubrication is required to be applied in an area that threatens sensitive electronic components.

Another more recent system is disclosed in U.S. Pat. No. 7,297,014, which is hereby incorporated by reference. That system incorporated a spring lock design to initially attach the two halves of the system, i.e., a receiver and a test adapter, together after which the use of a multi start Acme lead screw provided a, consistent, low torque means of engagement. The test adapter had a single spring lock pin extending roughly down the center of the test adapter toward the receiver. The single spring lock pin had a plurality of tab near its tip. When engaging the test adapter with the receiver, the tabs on the spring lock pin were initially engaged with a groove or ridge in an opening in the receiver adjacent the spring lock pin when the test adapter is aligned with the receiver for engagement. Thereafter, the handle on the test adapter was turned to cause the Acme lead screw to provide a constant low torque means to draw the test adapter into the receiver via the groove or ridge, which may be referred to as a spring lock bushing in the opening in the receiver.

SUMMARY OF THE INVENTION

In a preferred embodiment, the present invention is an interface device comprising a receiver and a test adapter. The receiver has on each outer side a groove or ridge for use in initial engagement of the test adapter with the receiver. The test adapter has an engagement member having a plurality of clips arranged such that at least one clip engages with the groove or ridge on a side of the receiver. The test adapter further has a screw mechanism for drawing the engagement in and out of the test adapter to engage and disengage the test adapter with the receiver.

In another preferred embodiment, the present invention is an interface comprising a test adapter. The test adapter comprises a test adapter frame having a face, a cover connected to the test adapter frame, an engagement mechanism and a handle or lever. The engagement mechanism comprises an engagement member having a top, first and second sides extending in a first direction from the top, and a threaded member extending from the top in a second direction opposite the first direction. A clip is connected to each of the first and second sides of the engagement member. The handle is rotatably connected to the cover. The handle comprises a lever extending outside the cover and a threaded portion engaged with the threaded member. The engagement member moves within the test adapter toward and away from the face of the test adapter frame when the handle is rotated back and forth. The present invention may further comprise a receiver for engaging or mating with the test adapter. The receiver may comprise a frame having first and second sides and a groove on each of the first and second sides of the frame for receiving a clip on the test adapter. The test adapter frame may further comprise an inner portion having a hollow therein through which at least one of the clips extends and an outer portion extending over the clips. The inner portion may further comprise a guide or alignment post extending therefrom for engaging with guide or alignment holes in the receiver for aligning the test adapter with the receiver during engagement. The handle may further comprise a substantially cylindrical portion extending through an opening in the cover and having a groove therein. A plurality of clips may extend from each of the first and second sides of the engagement member. The test adapter further may comprise a collar that may be connected to the test adapter frame or the cover. The threaded member may be formed integrally with the engagement members, such as being die-cast as a single component, or may be a separate component that is attached to the engagement member such as by a screw.

In another embodiment, the present invention is an interface comprised of a test adapter assembly. The test adapter assembly comprises a test adapter frame having a face, a cover connected to the test adapter frame and an engagement assembly. The engagement assembly comprises an engagement member having first and second ends, the first end being adjacent the cover, a screw extending from the first end and through a hole in the cover, a handle having a threaded portion engaged with the screw and a clip connected to the second end of the engagement member. The screw may be die-cast integrally with the engagement member or may be a separate part connected to the engagement member during assembly. The cover and/or test adapter frame may have a recessed portion or portions to improve the ability of a user to grip the test adapter. The recess or recesses may being filled with a material such as rubber to improve its gripping properties. The interface may further comprise a receiver having a frame having a groove for receiving a clip on the test adapter.

In still another embodiment, the present invention is an interface having a test adapter, a receiver and an engagement means for engaging the test adapter with the receiver. The test adapter is comprised of a test adapter frame and a cover connected to the test adapter frame, the cover and the frame forming a cavity having an open face. The receiver is comprised of a receiver frame, the receiver frame having an open face opposing the open face of the test adapter. The engagement means is comprised of a lever rotatably connected to the cover of the test adapter and having a threaded portion, an engagement member having a body, a screw means extending from the body, the screw means having threads engaged with the threaded portion of the lever, clip means connected to the body and clip receiving means on the receiver frame for engaging with the clip means.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

BRIEF DESCRIPTION OF THE DRAWINGS

For a more complete understanding of the present invention and the advantages thereof, reference is now made to the following description and the accompanying drawings, in which:

FIG. 3A is a front view of a test adapter in accordance with a preferred embodiment of the present invention.

FIG. 3B is a side view of a test adapter in accordance with a preferred embodiment of the present invention.

FIG. 3C is a top view of a test adapter in accordance with a preferred embodiment of the present invention.

FIG. 3D is a rear view of a test adapter in accordance with a preferred embodiment of the present invention.

DETAILED DESCRIPTION OF THE PREFERRED EMBODIMENTS

Figure 1:
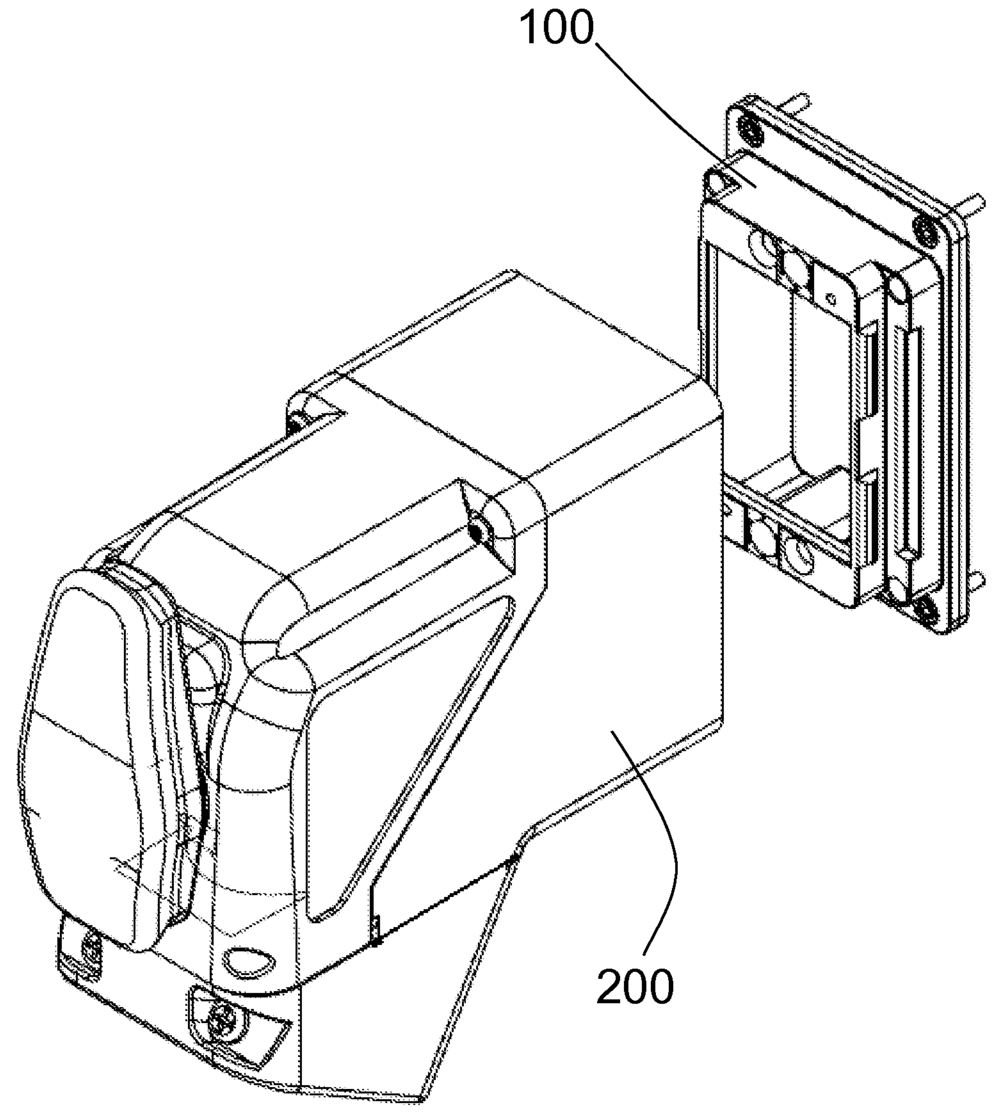
FIG. 1 is a perspective view of a receiver and test adapter of an interface in accordance with a preferred embodiment of the present invention in a disengaged position.
Figure 2:
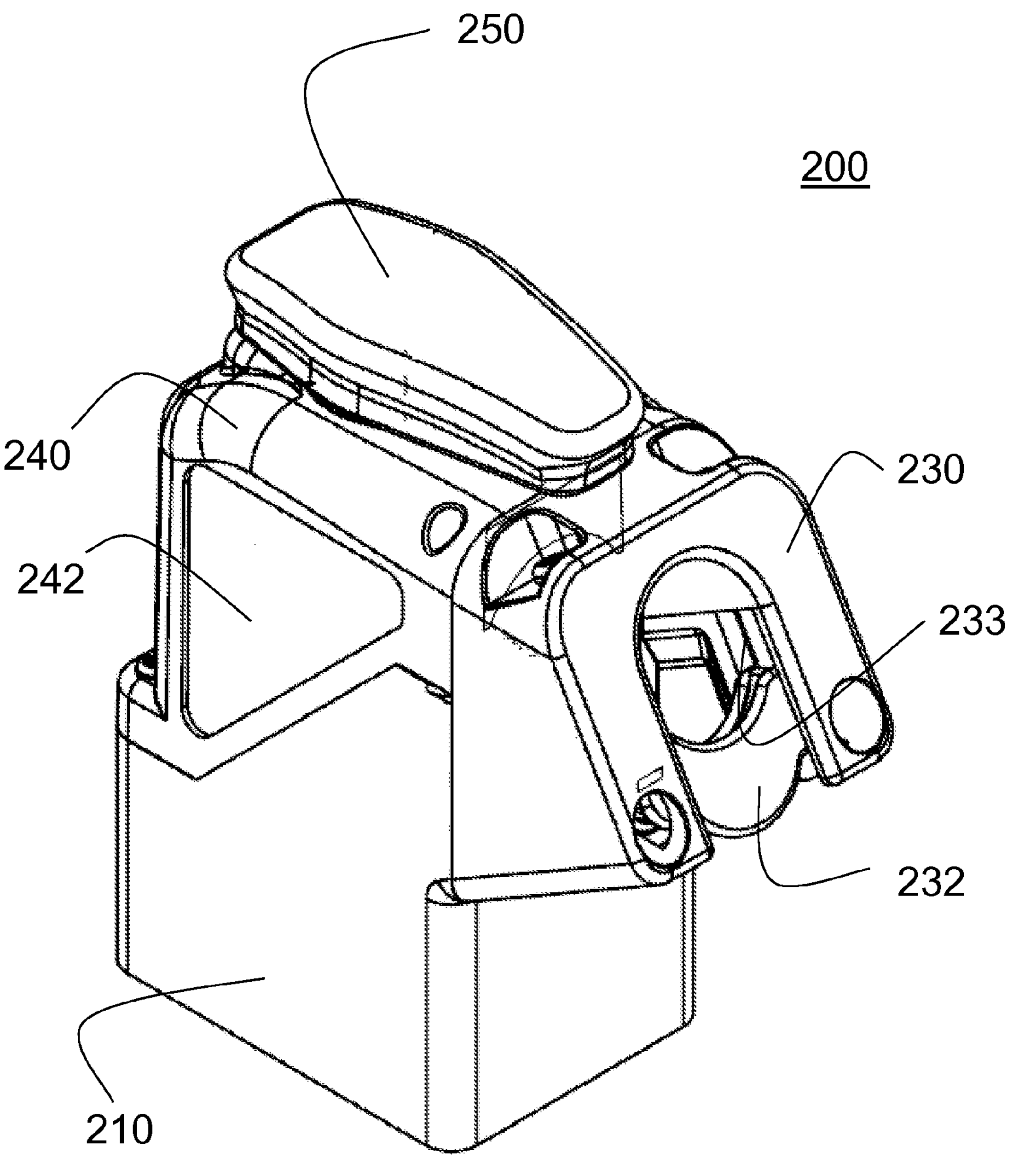
FIG. 2 is a perspective view of a test adapter in accordance with a preferred embodiment of the present invention.

A preferred embodiment of the present invention is described with reference to FIGS. 1-10. As shown in FIG. 1, an interface in accordance with the present invention has a receiver 100 and a test adapter 200.

The receiver 100, shown in detail in FIGS. 4 and 5A-D, has a frame 110 having a stepped configuration with an upper section 112 being the smallest, a middle section 114, and a lower flange section 116 around its exterior. The receiver frame 110 further has mounting members 130 in the flange 116 at each corner and a pair of guide pin openings 140 near each end of the frame 110 on the upper section 112. The mounting members 130, which may be for example screws through holds in the flange 116, may be used to mount the receiver to, for example, test equipment. The receiver has a groove or grooves 150 on each side. The frame 110 further may have means such as flanges with holes (not shown) in its interior for mounting modules or connectors to the frame 110.

The test adapter 200, shown in detail in FIGS. 2 and 3A-D, has a frame 210, a collar 230, a cover 240 and a handle 250. The cover 240 and collar 230 may be attached to the frame 210 by any of a variety of known means, such as with screws 234 and 216, respectively. Further, the edges of the frame 210 and cover 240 that oppose one another when the two are assembled together may have a tongue and groove structure 244, 246 (shown in FIG. 10). The cover 240 may, for example, be mounted to the frame 210 with screws 216 placed through holes 248 and into threaded holes 218 in the frame 210. The collar 230 may, for example, be mounted to the frame 210 via screws 234 in threaded holes 214 in the frame 210.

In a preferred embodiment, the frame 210 is in the shape of a rectangle having two pairs of opposing sides. The frame 210 may have a recess or recesses 212 (shown in FIGS. 8A and 8B) on its exterior to provide a means for a user to grip the test adapter 200. Further, the recess or recesses 212 may be filled with a material such a rubber to enhance the user's grip on the test adapter 200. The frame 210 further may have means such as flanges (not shown) with holes in its interior for mounting modules or connectors to the frame 210. The frame additionally has a pair of alignment pins 260 extending from the face of the frame 210 with one near each end as shown in FIG. 3B. As illustrated in FIGS. 3A and 3D, however, the alignment pins each preferably are off-center.

The cover 240 similarly may have a recess or recesses 242 for assisting a user's grip on the test adapter and may be filled with a material to enhance the user's grip.

The collar 230 is attached to the frame 210 via attachment means such as screws 236 (see FIG. 10) that are received by holes 214 in the frame 210. The collar 230 has a clamp 232 that slides within a pair of grooves 233, one on each of two sides of the collar 230. When in use, patchcords go through the collar to pins mounted in the test adapter frame 210, or in modules that are mounted in the test adapter frame. The clamp 232 may be tightened around the patch cords (not shown) via, for example, a screw or screws 234.

The handle 250 may have on it markings for indicating whether the engagement mechanism is in an open or closed position. The cover 240 likewise may have a marking or markings to assist in indicate the open or closed position of the handle 250.

Figure 6:
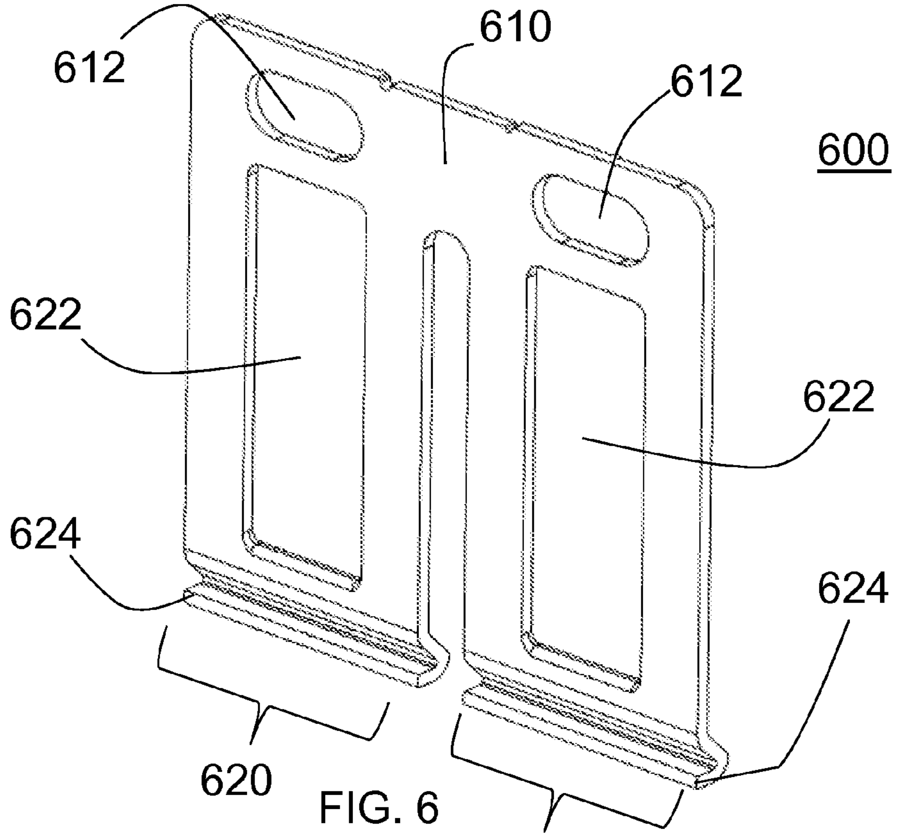
FIG. 6 is a perspective view of a test adapter clip in accordance with a preferred embodiment of the present invention.
Figure 7:
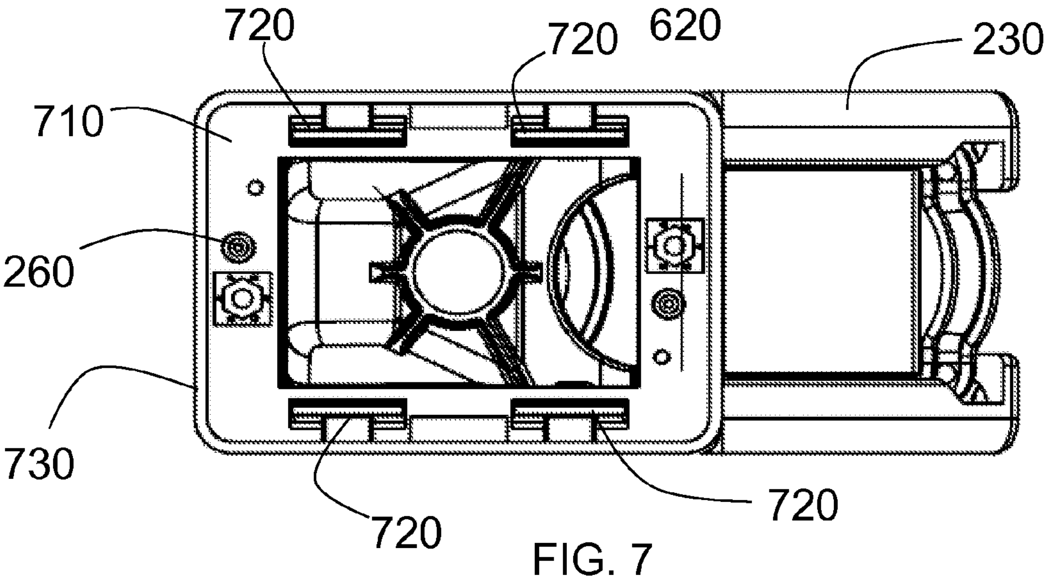
FIG. 7 is a bottom view of a test adapter in accordance with a preferred embodiment of the present invention.
Figure 10:
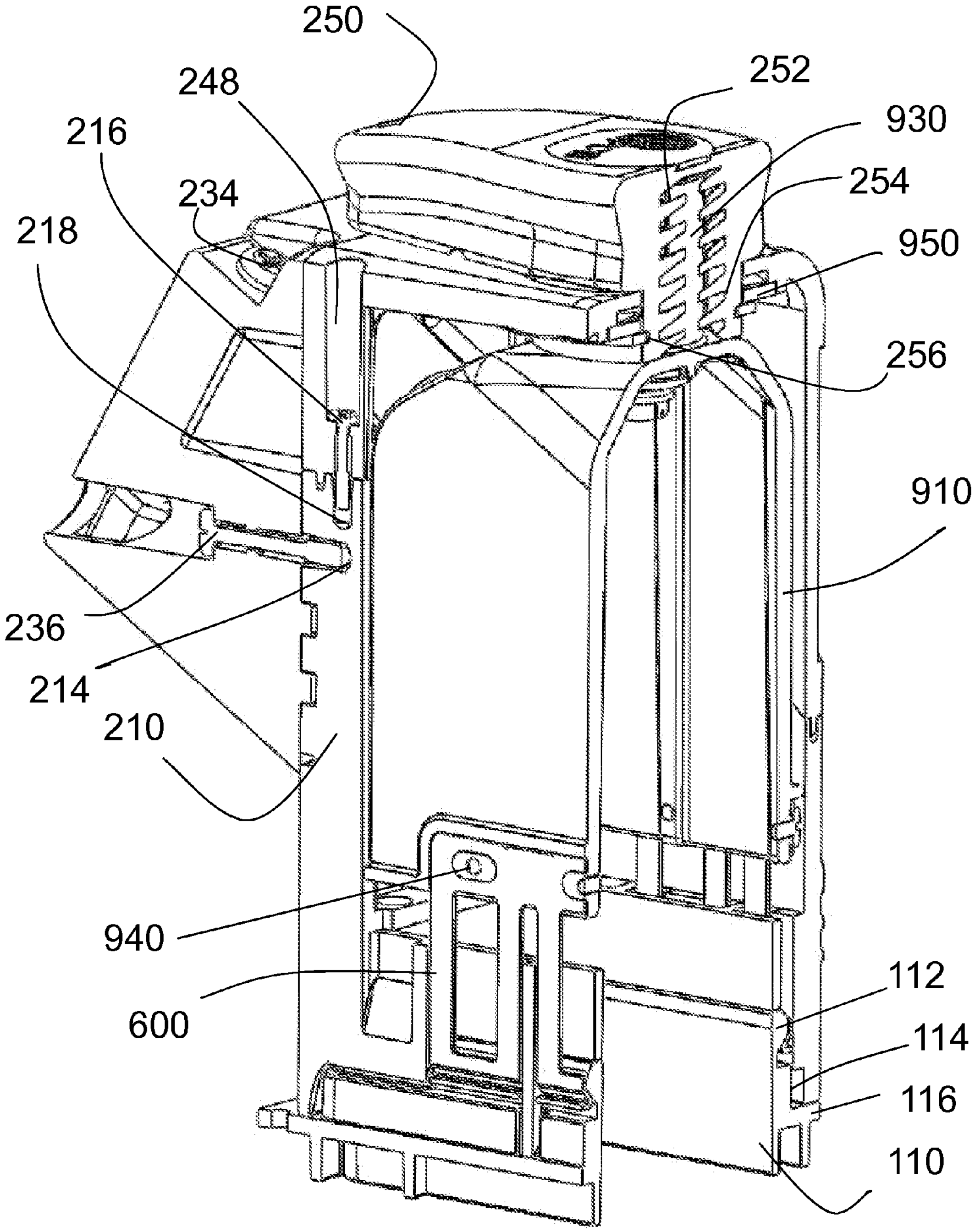
FIG. 10 is a cross-sectional view of an interface device in accordance with a preferred embodiment of the present invention in an engaged position.

The engagement mechanism of a preferred embodiment of the interface of the present invention is described with reference to FIGS. 6, 7 and 10. The test adapter 200 has within it a clip and screw assembly for engaging the test adapter 200 with the receiver 100. In a preferred embodiment, the clip and screw assembly has an engagement member 910 having a plurality of clips 600 extending from each side. A clip in accordance with a preferred embodiment of the invention is shown in FIG. 6. The clip has a base portion 610 with two mounting holes 612 therein. The clip 600 has two arms 620 extending from the base 610. Each arm has an opening 622 therein and clipping member 624 at an end away from the base 610.

The clips 600 are mounted to the engagement member 910 through known means, such as screws or rivets 940 through clip holes 612, such that a first end of each clip 600 is connected to the engagement member 910 and a second end of each clip 600 extends away from the engagement member 910. Alternatively, the clips may be formed integrally with the engagement member. The second end of each clip 920 has a lip therein for engaging with the grooves 150 in the sides of the receiver 100. The clips are formed of a material with sufficient properties to provide a bias such that the second end of the clip will move outward when engagement with a receiver is initiated and then still snap into the grooves on the side of the receiver frame. While two clips 920 are shown on each side the engagement member 910 in the preferred embodiment, other numbers of clips on each side, such as one, three or four, also may be used with the invention. Further, while the clip in the embodiments herein have two arms, other designs for the clip such as each clip having 1, 3 or some other number of arms are possible and will be apparent to those of skill in the art.

The engagement member 910 has a threaded portion or screw means 930 extending from the end opposite the end to which the clips are attached. The screw means or threaded portion 930 and engagement member 910 preferably are an integral die-cast part, but in other embodiments may be formed separately and then connected together through any known means such as with a screw. The threaded portion 930 of the engagement member 910 engages with a threaded portion 252 in the handle 250. While in the preferred embodiment the threaded portion 930 of the engagement member 910 is a male thread and the threaded portion 252 in the handle 250 is a female thread, the arrangement may be reversed such that the male thread is part of the handle 252 and the female thread is part of the engagement member. The handle 250 is mounted to the cover 240 such that it can rotate, which causes the thread 252 to rotate and thereby move the engagement member 910 toward or away from the receiver 100 and thereby engage or disengage the test adapter 200 and the receiver 100. The handle 250 has a substantially cylindrical portion 254 of a size to fit through a substantially circular hole in the cover 240. Near the end of the substantially cylindrical portion 254 is a groove 256.

Figure 8A:
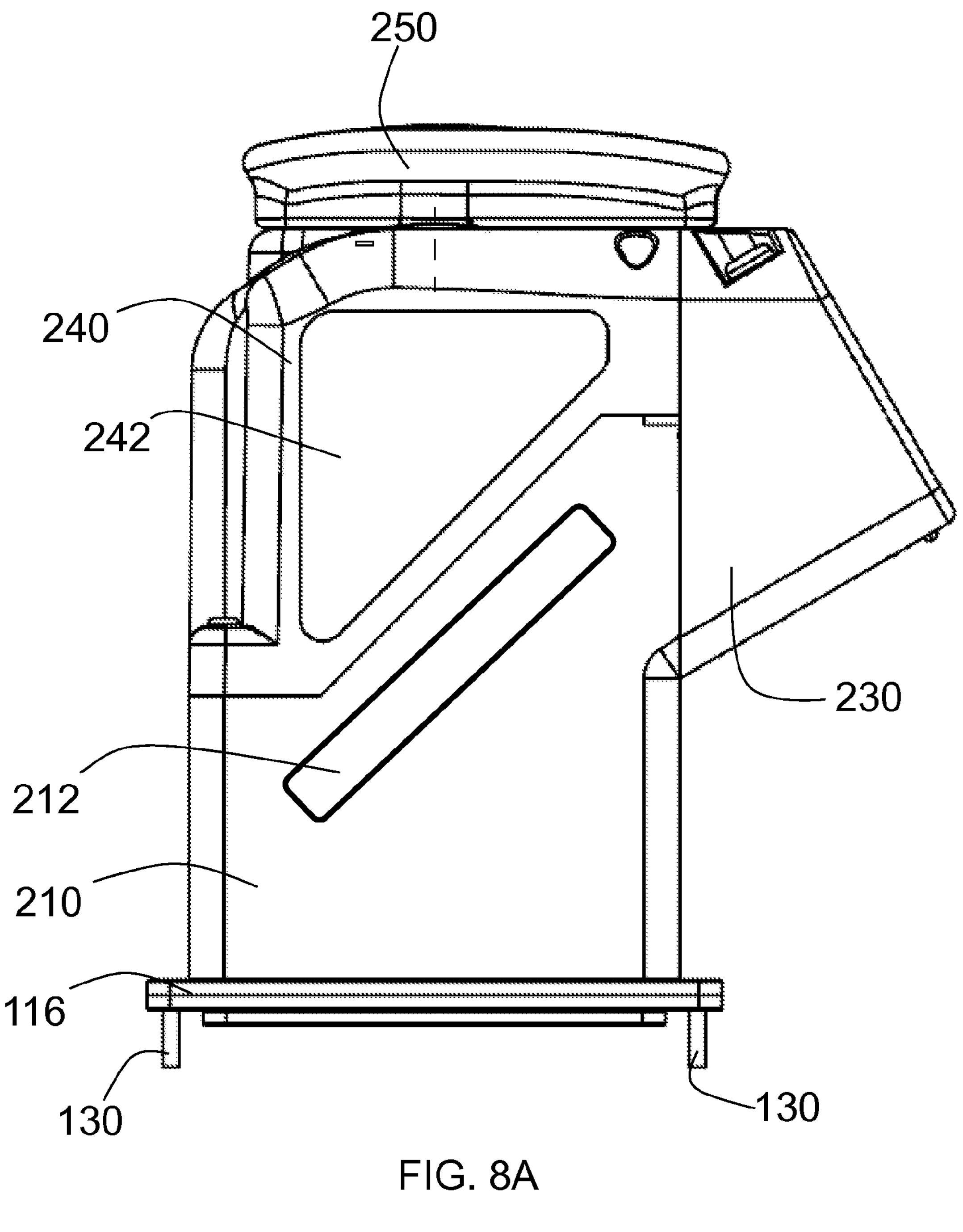
FIG. 8A is a side view of an interface device in accordance with a preferred embodiment of the present invention in an engaged position.
Figure 8B:
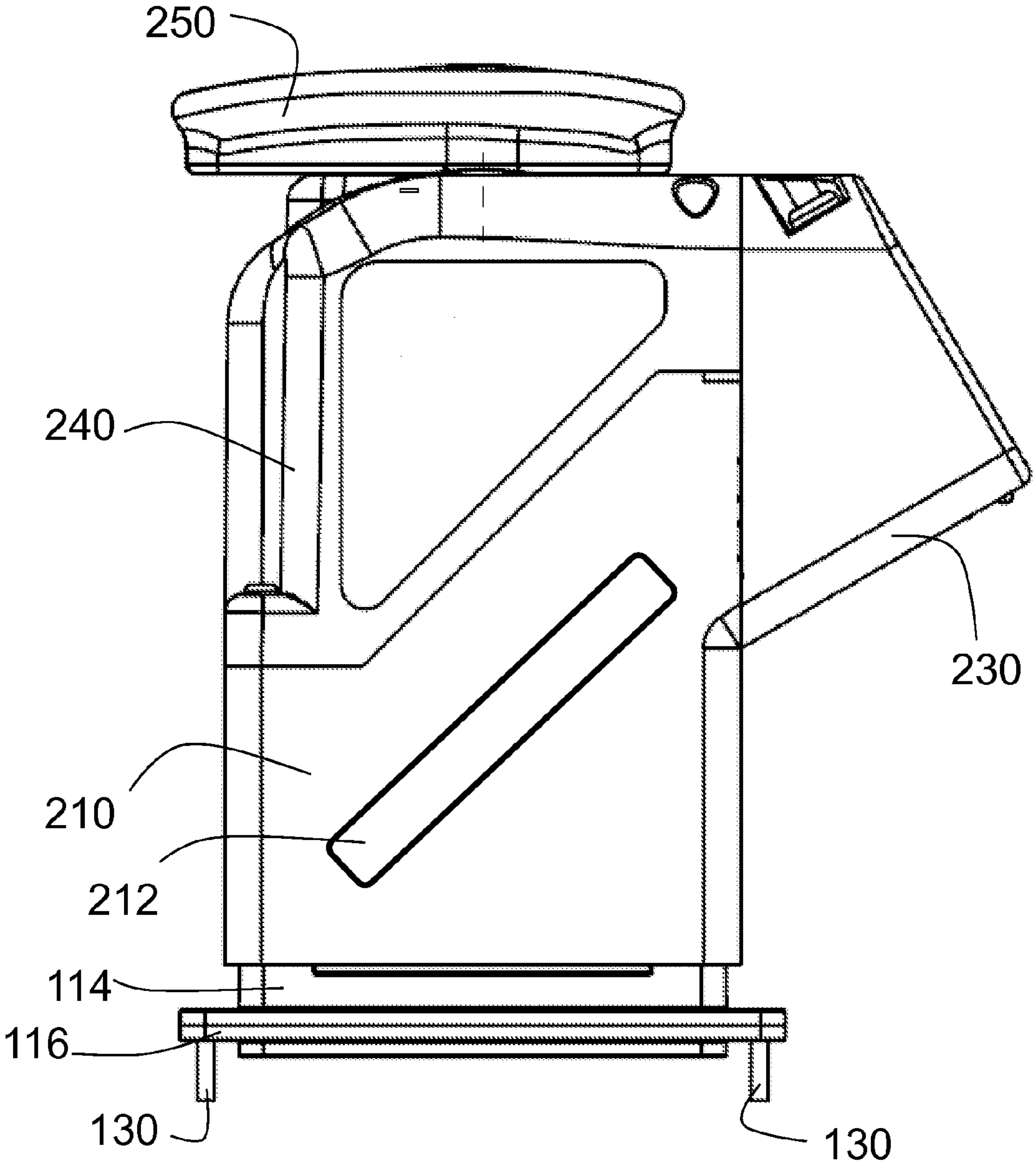
FIG. 8B is a side view of an interface device in accordance with a preferred embodiment of the present invention in a disengaged position.
Figure 9A:
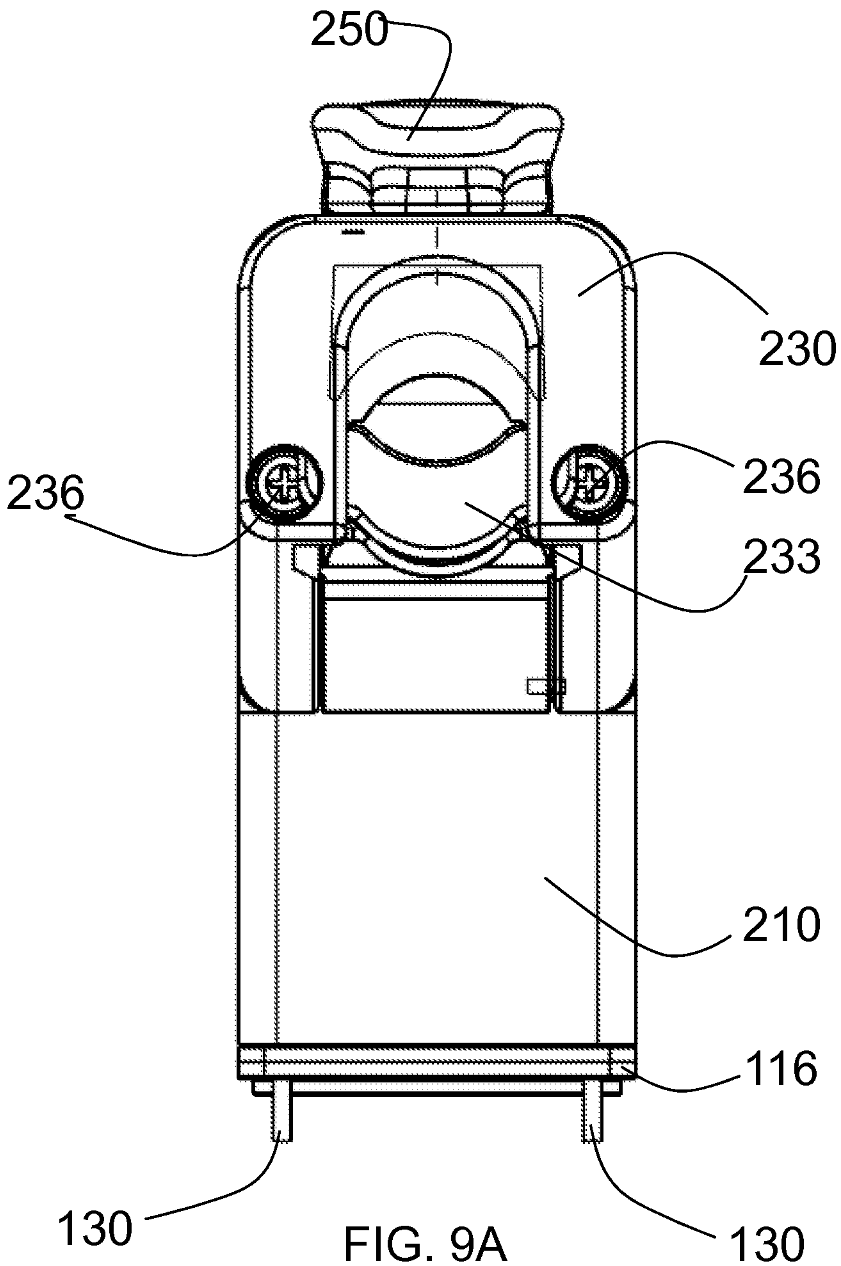
FIG. 9A is a front view of an interface device in accordance with a preferred embodiment of the present invention in an engaged position.
Figure 9B:
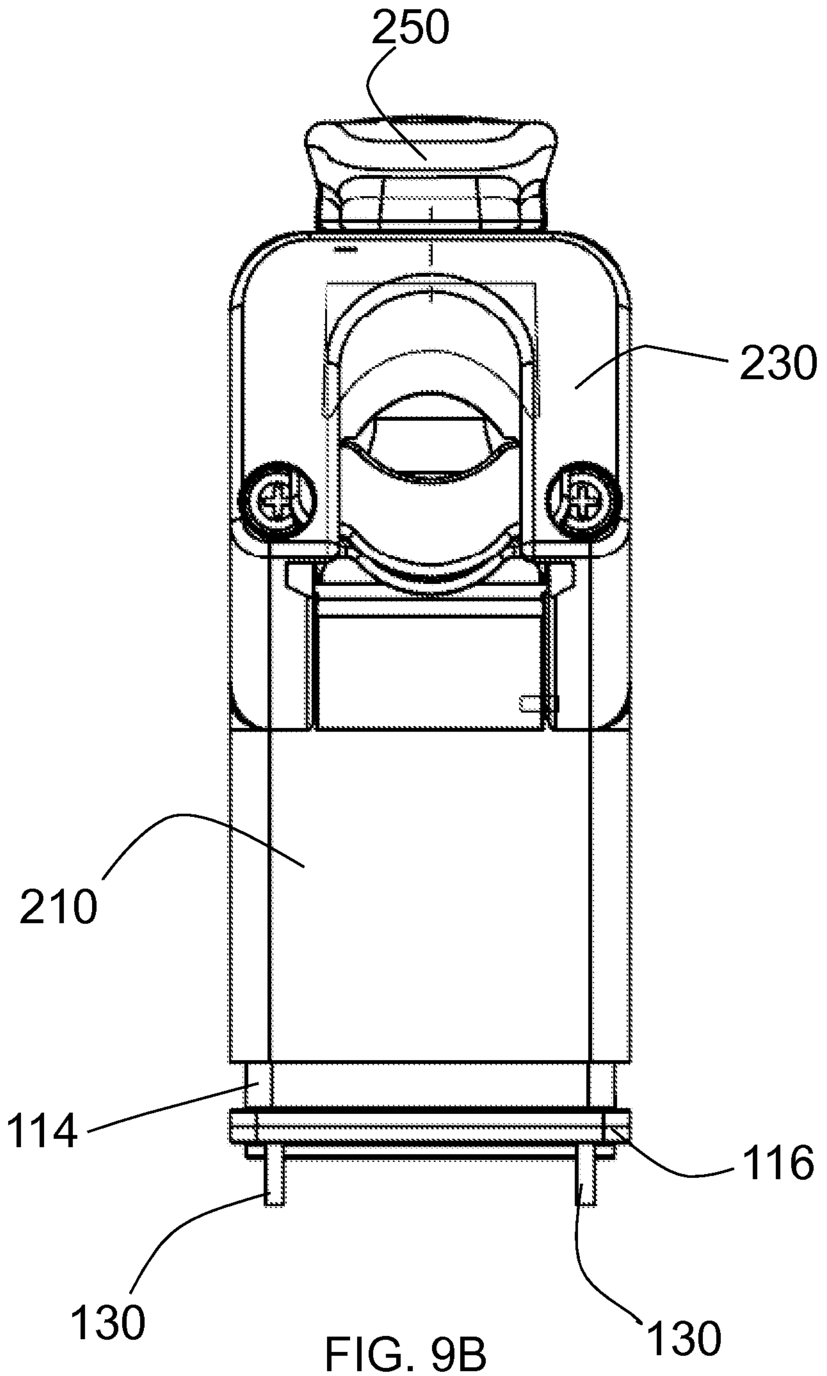
FIG. 9B is a front view of an interface device in accordance with a preferred embodiment of the present invention in a disengaged position.
Figure 11:
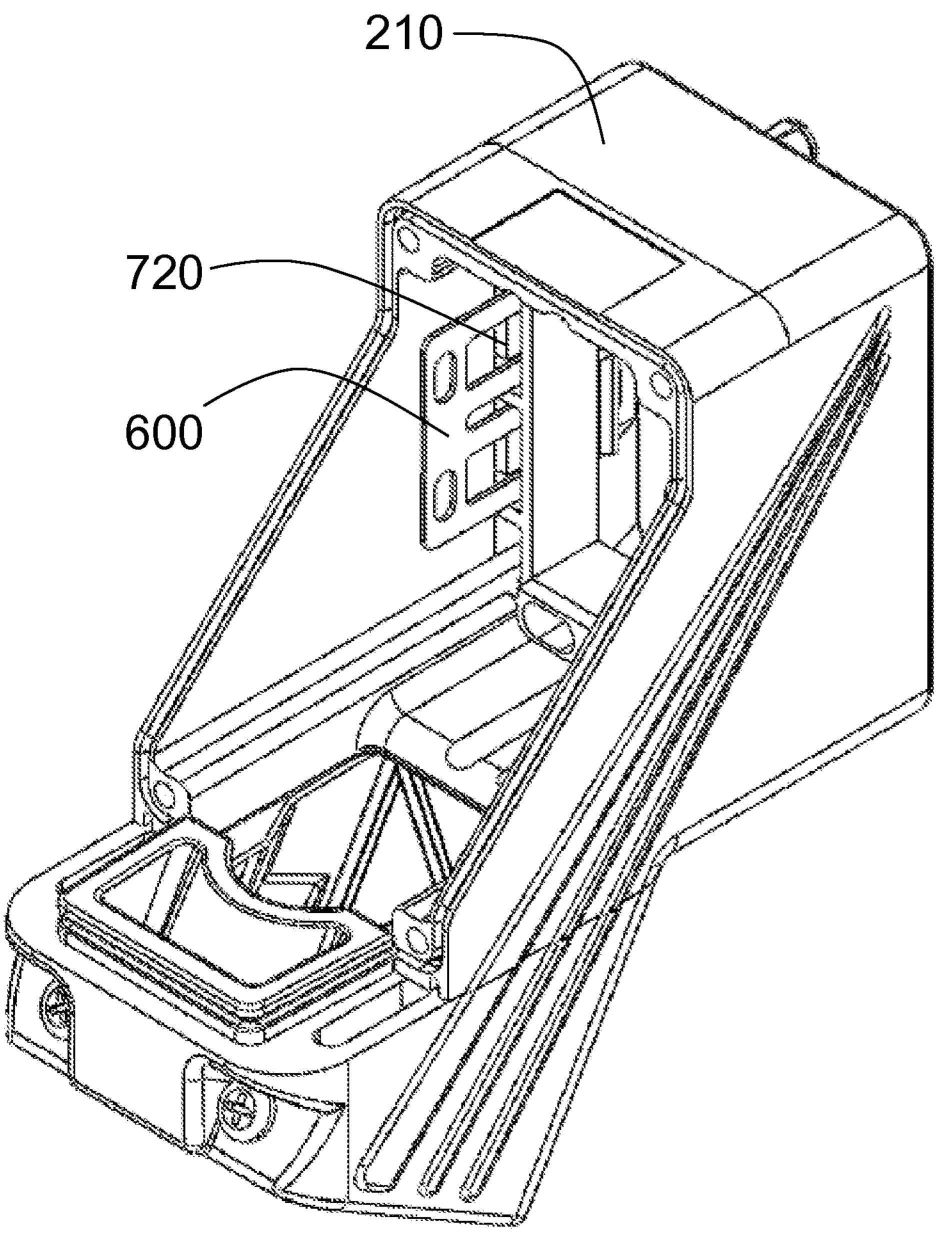
FIG. 11 is a perspective view of a test adapter frame in accordance with a preferred embodiment of the present invention.
Figure 12:
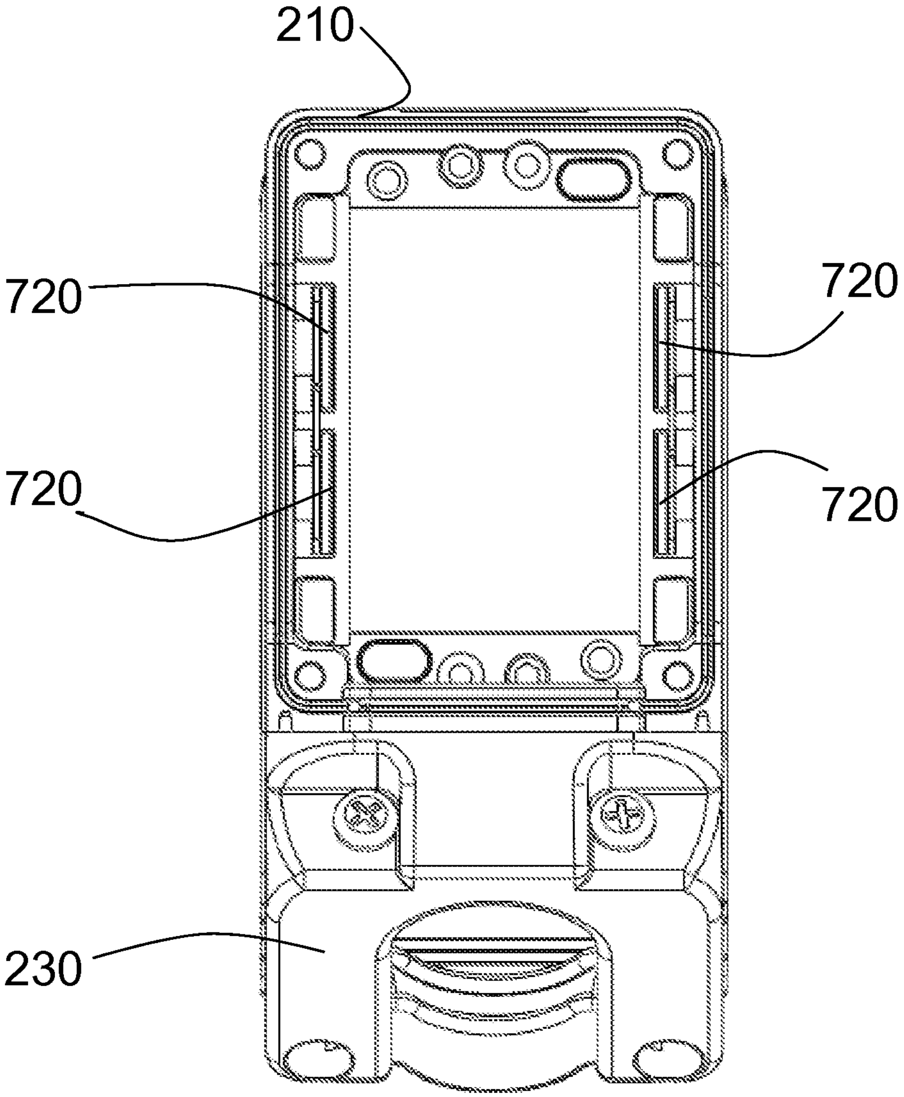
FIG. 12 is a bottom view of a test adapter frame in accordance with a preferred embodiment of the present invention.

During assembly, the substantially cylindrical portion 254 is placed through the cover 240 and a washer 950 is placed into the groove 256 to secure the handle or lever 250 on the cover 240 such that is can rotate but cannot be removed from the cover 240. The engagement member 910 is then placed into the cover 240 and the handle 250 is rotated such that the screw 930 is threaded into the threaded portion 252 of the handle 250. The cover 240 is then placed onto the test adapter frame 210 such that the clips 600 extend through hollowed portions 720 formed inner portion 710 of the test adapter frame 210, as shown in FIGS. 11 and 12. In this manner, the ends of the clips 600 extend through hollowed portions 720 of the inner portion 710 of the test adapter frame 210 such that they can engage with the grooves 150 on the receiver 100 while the outer wall 730 of the test adapter frame 210 can extend over the clips 600 and the upper portion 112 and middle portion 114 of the receiver 100 when the test adapter 200 is engaged with the receiver 100 as shown in FIGS. 8A-B and 9A-B. FIGS. 8A and 9A show the test adapter 200 fully engaged with the receiver 100 after the handle 250 has been turned to an engaged position such that the outer wall 730 covers the middle and upper portions 114, 112 of the receiver 100 while FIGS. 8B and 9B show the test adapter 200 on the receiver 100 with the clips 600 engaged with the grooves 150 in the receiver 100 but with the handle 250 in a disengaged position. This allows to the outer wall 730 of the test adapter frame 210 to conceal and protect the clips 600 and engagement member 910.

Figure 4:
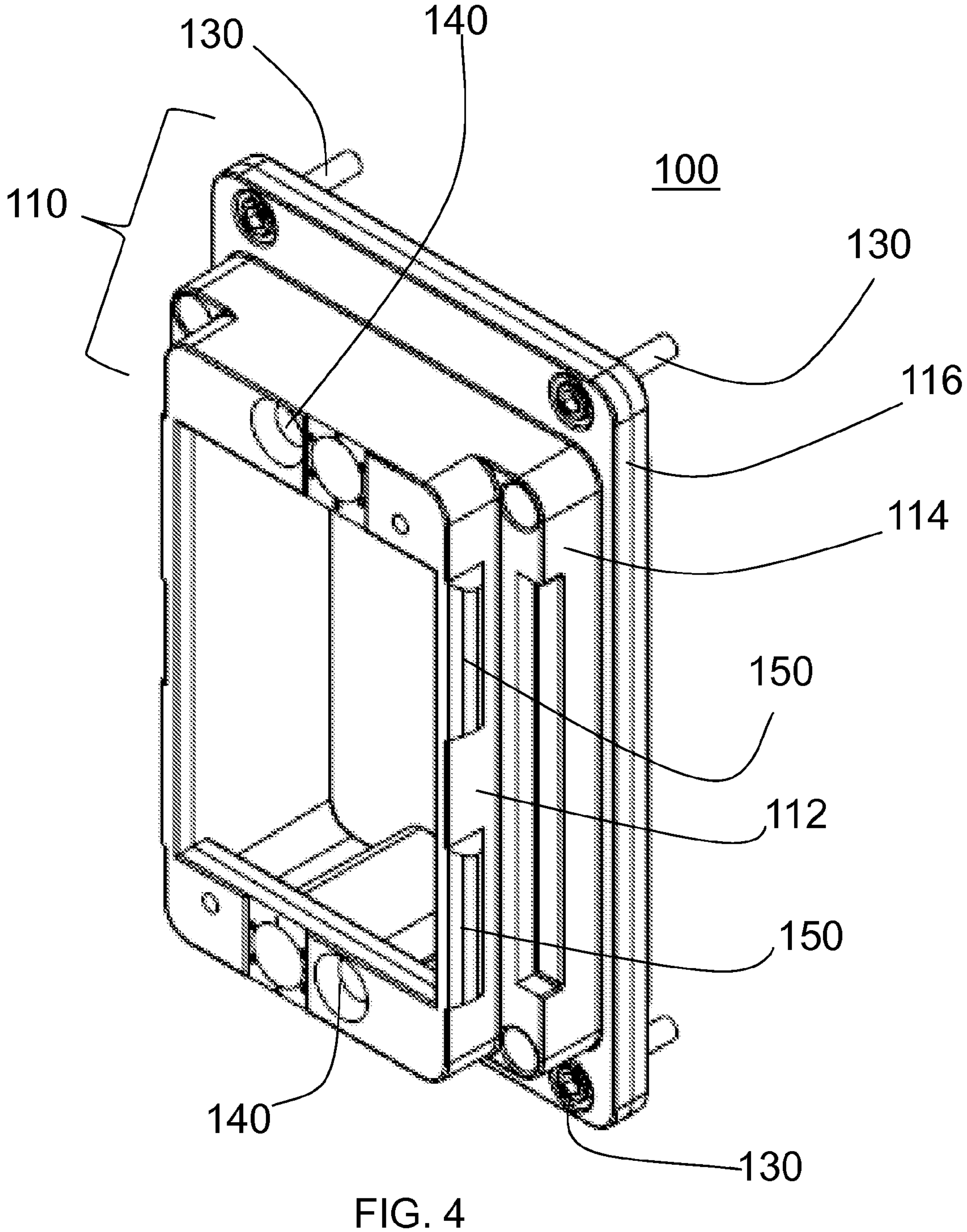
FIG. 4 is a perspective view of a receiver in accordance with a preferred embodiment of the present invention.
Figure 5A:
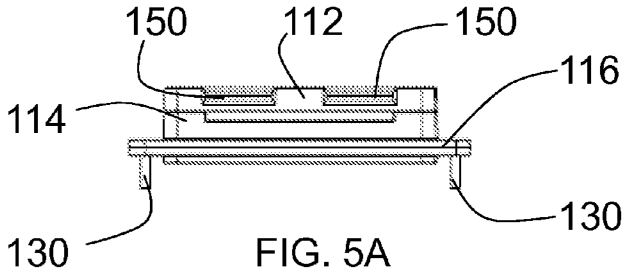
FIG. 5A is a front view of a receiver in accordance with a preferred embodiment of the present invention.
Figure 5B:
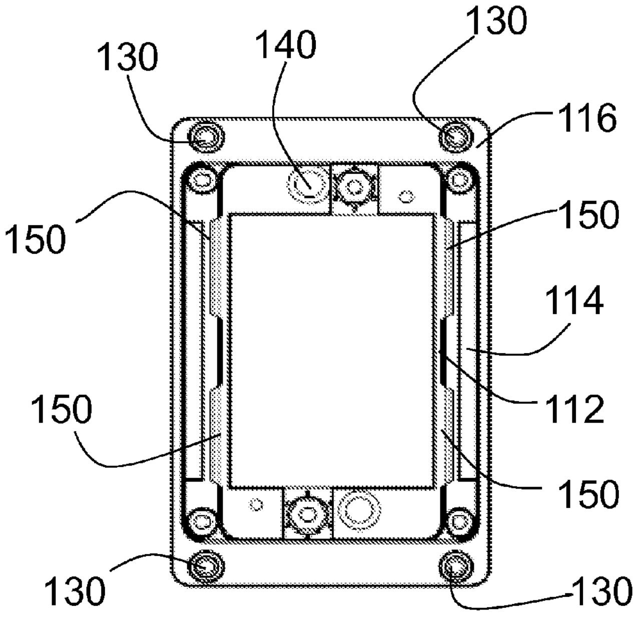
FIG. 5B is a top view of a receiver in accordance with a preferred embodiment of the present invention.
Figure 5C:
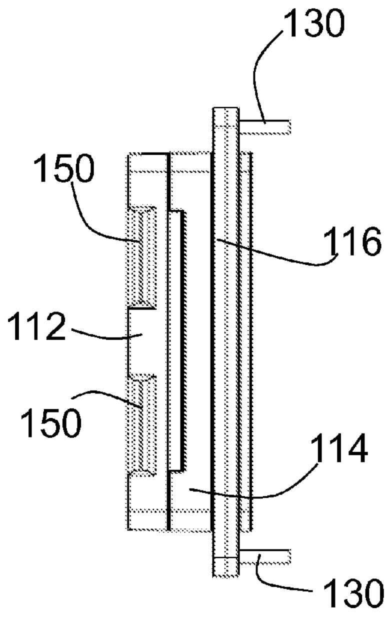
FIG. 5C is a side view of a receiver in accordance with a preferred embodiment of the present invention.
Figure 5D:
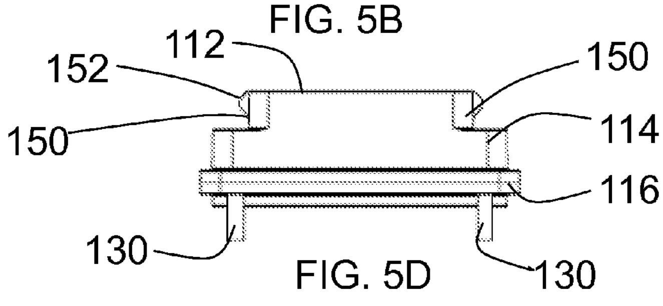
FIG. 5D is a rear view of a receiver in accordance with a preferred embodiment of the present invention.

To engage a test adapter 200 with a receiver 100, the test adapter 200 is placed in a position adjacent the receiver 100 to align the guide pins 260 in the test adapter 200 with the corresponding guide or alignment openings 140 in the receiver 100. The test adapter 200 is then manually pushed toward the face of the receiver 100 to cause the clips 920 on the engagement member 910 in the test adapter 200 to engage with the grooves 150 in the sides of the receiver 100. As shown in FIGS. 4 and 5D, the upper portion of 112 of the receiver frame 110 has a rounded portion 152 adjacent the grooves or indents 150. This rounded portion causes the portion 624 of the clip 600 to be pushed outward as the test adapter is manually pushed toward the receiver thereby sliding over the round portion and then securing into the groove or indent 150 to connect the test adapter to the receiver. This position is shown in FIGS. 8B and 9B. This initial engagement places and holds the test adapter 200 in a properly aligned position with the receiver 100 with the exertion of a relatively low amount of force. The handle 250 on the test adapter 200 is then rotated by 180 degrees. This provides mechanical advantage via the thread 930 to pull the engagement member 910 toward the handle 250 and thereby draw the test adapter 200 into the receiver 100 via the clips 600 pulling on the grooves 150. This pulling action causes pins (not shown) in the test adapter 200 to engage with pins (not shown) in the receiver 100. To disengage the test adapter 200 from the receiver 100, the handle 250 is rotated back 180 degrees to push the test adapter 200 away from the receiver 100 via the clip pushing against the grooves 150, thereby disengaging the pins in the test adapter 200 from the pins in the receiver 100. In the preferred embodiment, two positive stops are provided to prevent the handle from being rotated more than 180 degrees. First, during assembly, the handle is rotated until the threaded portion or screw portion of the engagement member is fully engaged with the thread in the handle. This provides a positive stop for a fully disengaged position. Once the test adapter is assembled, a ridge in the test adapter frame opposes the bottom edge, or at least a portion of the bottom edge of the engagement member when the handle is rotated 180 degrees from the fully disengages position. This provides a positive stop for the fully engagement position. Other arrangements in which the handle 250 is rotated more or less than 180 degrees to achieve engagement or disengagement of course may be used with the present invention.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. An interface comprising:

a test adapter comprising:

- a test adapter frame having a face;
- a cover connected to said test adapter frame;
- an engagement mechanism, said engagement mechanism comprising:
  - an engagement member having a top, first and second sides extending in a first direction from said top, and a threaded member extending from said top in a second direction opposite said first direction; and
  - a clip connected to each of said first and second sides of said engagement member; and
- a handle rotatably connected to said cover, wherein said handle comprises:
  - a lever extending outside said cover; and
  - a threaded portion engaged with said threaded member;
- wherein said engagement member moves within said test adapter toward and away from said face of said test adapter frame when said handle is rotated back and forth.

2. An interface according to claim 1 further comprising:

a receiver comprising:

- a frame having first and second sides;
- a groove on each of said first and second sides of said frame for receiving a clip on said test adapter.

3. An interface according to claim 1, wherein said test adapter frame further comprises:

- an inner portion having a hollow therein through which at least one of said clips extends; and
- an outer portion extending over said clips.

4. An interface according to claim 1, wherein said inner portion further comprises a guide post extending therefrom.

5. An interface according to claim 1, wherein said handle further comprises a substantially cylindrical portion extending through an opening in said cover and having a groove therein.

6. An interface according to claim 1 wherein a plurality of clips extend from each of said first and second sides of said engagement member.

7. An interface according to claim 1, wherein said test adapter further comprises a collar.

8. An interface according to claim 7, where said collar is connected to said test adapter frame.

9. A test adapter according to claim 1 wherein said threaded member is die-cast integrally with said engagement member.

* * * * *